(12) United States Patent
Knight et al.

(10) Patent No.: US 9,261,563 B2
(45) Date of Patent: Feb. 16, 2016

(54) SYSTEM AND METHOD FOR IMPROVED BATTERY CHARGE STATE DETERMINATION

(71) Applicant: Zero Motorcycles, Inc., Scotts Valley, CA (US)

(72) Inventors: Nathan Glenn Knight, Santa Cruz, CA (US); Kenyon Michael Kluge, Santa Cruz, CA (US); Ryan John Biffard, Soquel, CA (US); Lucas Remington Workman, Scotts Valley, CA (US)

(73) Assignee: Zero Motorcycles, Inc., Scotts Valley, CA (US)

( * ) Notice: Subject to any disclaimer, the term of this patent is extended or adjusted under 35 U.S.C. 154(b) by 385 days.

(21) Appl. No.: 13/671,271

(22) Filed: Nov. 7, 2012

(65) Prior Publication Data
US 2014/0125344 A1    May 8, 2014

(51) Int. Cl.
*G01N 27/416* (2006.01)
*G01R 31/36* (2006.01)

(52) U.S. Cl.
CPC ........ *G01R 31/3606* (2013.01); *G01R 31/3651* (2013.01); *G01R 31/361* (2013.01); *G01R 31/362* (2013.01)

(58) Field of Classification Search
CPC .............. Y02E 60/12; G01R 31/3686; G01R 31/3682; H01M 6/505; H01M 10/488
USPC ......................................................... 324/426
See application file for complete search history.

(56) References Cited

U.S. PATENT DOCUMENTS

| | | | |
|---|---|---|---|
| 2003/0069704 A1* | 4/2003 | Bean ............................... | 702/63 |
| 2004/0001996 A1* | 1/2004 | Sugimoto ........................ | 429/61 |
| 2011/0156713 A1* | 6/2011 | Akamine et al. .............. | 324/433 |

* cited by examiner

*Primary Examiner* — Arun Williams
(74) *Attorney, Agent, or Firm* — Gard & Kaslow LLP

(57) ABSTRACT

Improved battery charge state determination. The estimated charge state of a battery comprising a plurality of series connected cells is updated using Coulomb counting during battery operation, for example, while operating an electric vehicle motor. The estimated charge state may be coupled to a fuel gauge. When the battery is in a no load state, a no load voltage measurement is made. During testing, a set of relationships between battery no load voltages and associated known good charge states have been determined. The measured no load voltage is compared to the set of no load voltages associated with known good charge states. A known good charge state associated with the measured no load voltage is used to update the estimated charge state, thereby providing a more accurate indication of the actual battery charge state, thus providing a more robust and accurate fuel gauge.

24 Claims, 3 Drawing Sheets

SYSTEM AND METHOD FOR IMPROVED BATTERY CHARGE STATE DETERMINATION

BACKGROUND

1. Field of the Invention

The present invention relates generally to rechargeable battery systems for electric vehicles, and more particularly, to fuel gauges for electric vehicles.

2. Description of the Prior Art

Vehicle operators and passengers alike are familiar with fuel gauges, giving a visual indication of fuel remaining.

With the move to electric vehicles, such fuel gauges have moved as well. In an electric vehicle, the fuel gauge displays an estimate of energy remaining in the vehicle's rechargeable battery.

One way in which this is done is by displaying on the fuel gauge an estimated charge state of the rechargeable battery system in the vehicle. The battery charge state is typically estimated using a known technique such as Coulomb counting. Coulomb counting counts the amount of energy going into and out of the battery, thereby maintaining an estimated charge state for the battery.

However, Coulomb counting has a problem with accumulated error which results in reduced accuracy over time. As understood in the art, Coulomb counting using discrete measurements is an approximation of an ideal process of integrating current flow continuously over time. Practical approaches use current measurements taken at discrete intervals of time to represent current flow over the interval. Such measurements taken during each interval represent an approximation, in which small errors accumulate over time. These small errors accumulate in the determined charge state over time. As the charge state maintained by Coulomb counting diverges from the actual charge state of the battery, so the reading on the fuel gauge becomes increasingly inaccurate over time. This creates a problem if the operator cannot rely on the fuel gauge to accurately indicate the battery charge state.

What is needed is a way to improve the accuracy of fuel gauges as may be used in battery operated devices, including electric vehicles.

SUMMARY

In one embodiment is provided a system and method for improved battery charge state determination. The estimated charge state of the battery is used, for example, by a fuel gauge of an electric vehicle to display the amount of energy remaining in the battery.

Coulomb counting is used to maintain the estimated charge state for the battery during both electric vehicle operation and charging.

Through testing, a set of relationships between no load voltages and associated known good charge states has been determined.

When the battery is under no load, for example when a battery operated vehicle is turned off, a no load battery voltage is measured. The no load voltage is used to determine if a known good charge state is associated with the no load voltage; if the no load voltage has an associated known good charge state, the estimated charge state is updated with the known good charge state.

In some embodiments, if the no load voltage does not match a no load voltage in the set of relationships, interpolation is used between the two bounding entries in the set of relationships to determine the known good charge state.

In some embodiments, the battery comprises a plurality of storage cells connected electrically in series. In a further embodiment, the no load voltage measurement is performed on each storage cell in the battery. The storage cell with the lowest no load voltage among the storage cells making up the battery is selected. If that no load voltage is associated with a known good charge state, the estimated charge state is updated with the known good charge state from the storage cell with the lowest no load voltage.

Updating the estimated charge state with a known good charge state corrects the estimate charge state for accumulated errors.

DETAILED DESCRIPTION

Described herein are various embodiments of an improved battery charge state determination. The charge state of the battery is used, for example, by the fuel gauge of an electric vehicle to display the amount of energy remaining in the vehicle battery.

During battery use, for example in the operation of an electric vehicle, an estimated charge state of the battery is updated by a battery controller using the technique of Coulomb counting. Coulomb counting measures the energy flowing into and out of the battery. The battery controller measures current flow to and from the battery using a current sensor. Current flowing out of the battery, for example during operation of a motor or other load, decreases the estimated charge state of the battery. Current flowing into the battery, for example during regenerative braking or charging, increases the estimated charge state of the battery.

The battery controller uses measurements made at intervals in time to estimate current flow during the interval. As is known to the art, small errors in these measurements result in errors in the estimated charge state, which accumulate over time. As such, these errors in estimated charge state are reflected in errors displayed by the fuel gauge.

Through testing as explained further elsewhere herein, a set of relationships between no load voltages and associated known good charge states has been determined.

When the battery is in a no load state, for example when an electric vehicle is turned off, if the battery's no load voltage matches one of the no load voltages in the set relationships, the estimated charge state is updated with the known good charge state associated with the no load voltage, correcting the estimated charge state for accumulated errors. In an additional embodiment, if a match to a no load voltage in the set of relationships is not found, interpolation (e.g., linear approximation) between two bounding entries in the set of relationships is used to determine a known good charge state.

Another embodiment relies on the battery construction as a series connected plurality of storage cells. No load voltage measurements are made on each cell, and the lowest no load voltage is selected. If that no load voltage matches one of the no load voltages in the set of no load voltages and associated known good charge states, the estimated charge state is updated with the known good charge state associated with the no load voltage, which corrects for accumulated errors in the estimated charge state, basing the estimated charge state for the battery on the individual cell in the battery having the lowest no load voltage. In an additional embodiment, if a match to a no load voltage in the set of relationships is not found, interpolation (e.g., linear approximation) between two bounding entries in the set of relationships is used to determine a known good charge state. As such, the display on the fuel gauge will reflect the battery cell with the lowest charge state.

Figure 1:
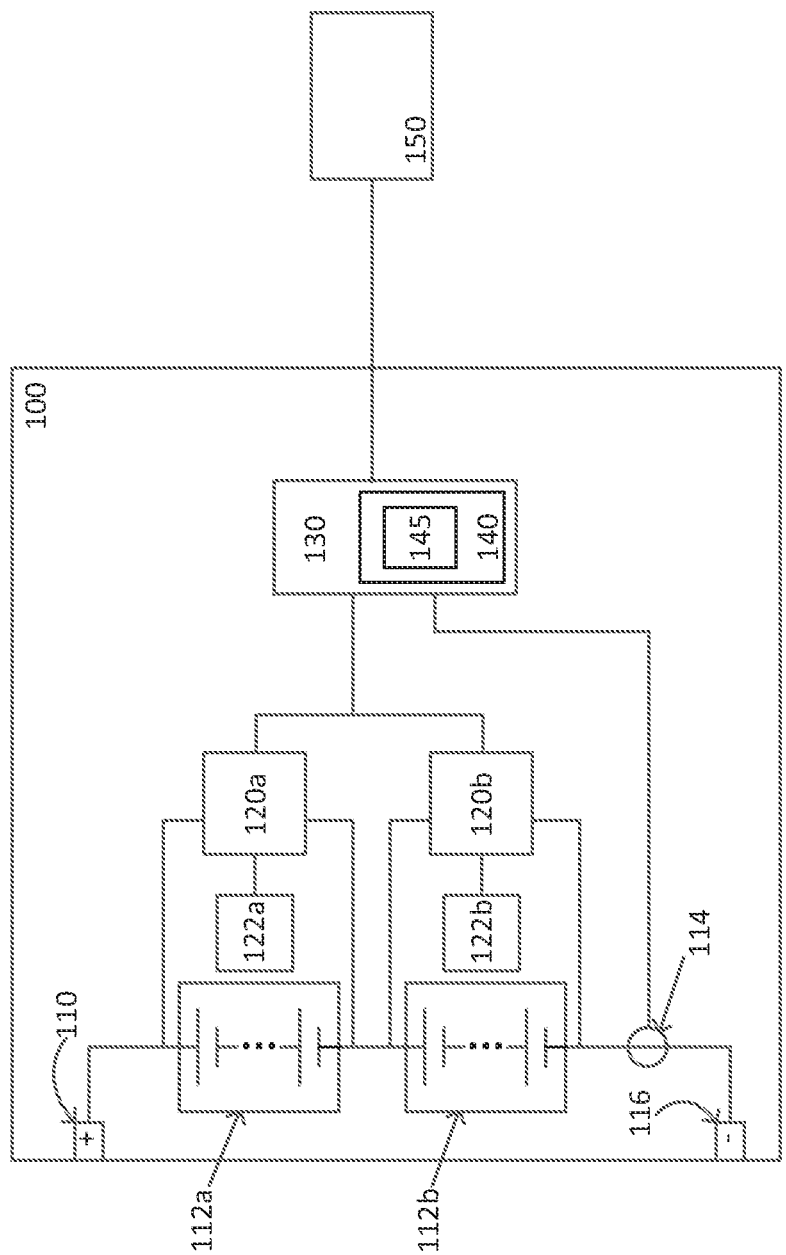
FIG. 1 is a block diagram of a rechargeable battery system according to one embodiment.

Referring now to FIG. 1, an embodiment of a battery subsystem 100 coupled to a fuel gauge 150 is shown. Battery subsystem 100 comprises two or more series connected storage cells 112a, 112b, current sensor 114, positive terminal 110, negative terminal 116, battery monitors 120a, 120b with battery sensors 122a, 122b, and battery controller 130 with memory 140. Positive terminal 110 and negative terminal 116 connect to devices such as external chargers and a motor controller, not shown.

Positive terminal 110 is coupled to a positive lead of the series connected rechargeable storage cells 112a. Similarly negative terminal 116 is coupled to a negative lead of the series connected rechargeable storage cells 112b.

Battery controller 130 monitors rechargeable storage cells 112a and 112b using battery sensors 122a and 122b connected to battery monitors 120a and 120b, for example measuring cell voltages. Battery controller 130 is coupled to a current sensor 114 for sensing battery current flow. Battery monitor 130 is coupled to fuel gauge 150.

In one embodiment and as shown in FIG. 1, each of storage cells 112a, 112b comprise a plurality of individual rechargeable storage cells. Storage cells 112a comprise a plurality of series connected rechargeable storage cells. Similarly, storage cells 112b comprise a plurality of series connected rechargeable storage cells. In one embodiment, the rechargeable storage cells are Lithium-ion cells, such as Lithium Nickel Manganese Cobalt oxide (NMC) pouch cells. Other embodiments may use different Lithium-ion chemistries.

In one embodiment, battery controller 130 is a Texas Instruments® Stellaris ARM Cortex-M3 System on a Chip (SOC), providing a CPU, volatile and nonvolatile memory, and advanced I/O. Memory 140 may be internal to battery controller 130, such as a portion of the nonvolatile memory, or may be an external nonvolatile memory such as a Flash memory device or an Electrically Erasable Programmable Read Only Memory (EEPROM) coupled to battery controller 130.

Current sensor 114 provides information to battery controller 130 on the current flowing into or out of rechargeable storage cells 112a, 112b. As an example, current flows out of storage cells 112a, 112b when driving a motor or other load (not shown). Current flows into storage cells 112a, 112b during charging or regenerative braking.

In one embodiment, current sensor 114 is a resistive current shunt. By placing a known low resistance between storage cells 112b and negative terminal 116, current flowing through the shunt produces a voltage drop across the shunt which is proportional to the current flowing through the shunt according to Ohm's Law.

In another embodiment, current sensor 114 is a Hall-effect sensor, producing an output to battery controller 130 which is a function of sensing the magnetic field generated by current flow through the conductor connecting cells 112b and negative terminal 116.

Current sensor 114 may be located anywhere along the current path between positive terminal 110 and negative terminal 116, as the current flow through each element of a series connection is the same. Measured current flow will be the same if current sensor 114 is located between positive terminal 110 and storage cells 112a, between storage cells 112a and 112b, or as shown in FIG. 1 between storage cells 112b and negative terminal 116.

In one embodiment, storage cells in 112a and 112b comprise individual storage cells connected in series, each supported by a battery monitor. As an example, each storage cell 112a is coupled to battery monitor 120a and battery sensor 122a such as the Texas Instruments® PL536 battery monitor integrated circuit and supporting circuitry. Such an embodiment organizes individual storage cells in series strings of up to six storage cells each, and can provide battery controller 130 with individual storage cell voltages, temperature of the group of storage cells, and can support storage cell balancing during charging.

In one embodiment of battery subsystem 100, storage cells 112a and 112b are implemented as 28 rechargeable storage cells in five series connected groups of storage cells; four groups of six series connected storage cells, and one group of four series connected storage cells. Each of these five groups of cells has a battery monitor 120 and battery sensor 122. In one embodiment, each storage cell is a Lithium Nickel Manganese Cobalt (NMC) pouch cell. This produces a battery pack with a nominal voltage of 102.2 Volts and a fully charged voltage of 116.2 Volts. Each NMC pouch cell has a capacity of between 23 and 25 Amp-hours, for a battery pack energy of between 2400 and 2800 Watt-hours. Peak current levels may exceed 200 Amps.

It is understood that in alternate embodiments of storage cells 112a and 112b, smaller capacity storage cells, such as 2 to 3 Amp-hour storage cells may be placed in parallel, and these storage cells then placed in series.

Battery controller 130 is loaded with purpose-built firmware to communicate with current sensor 114, battery monitors 120a, 120b, and communicate with fuel gauge display 150 as described herein.

In operation according to one embodiment, battery controller 130 tracks the estimated charge state of storage cells 112a and 112b using a technique known as Coulomb counting (also known as charge counting), providing the estimated charge state to fuel gauge display 150.

A Coulomb in the International System of Units (SI) is a derived unit of electrical charge, defined as the charge transported by a current of one Ampere for one second.

Battery controller 130 reads current sensor 114 to measure current flowing into and out of storage cells 112a, 112b over time to track the estimated charge state. Current flowing out of the battery decreases the estimated charge state, while operations such as charging or regenerative braking put energy back into the battery, increasing the estimated charge state.

Figure 2:
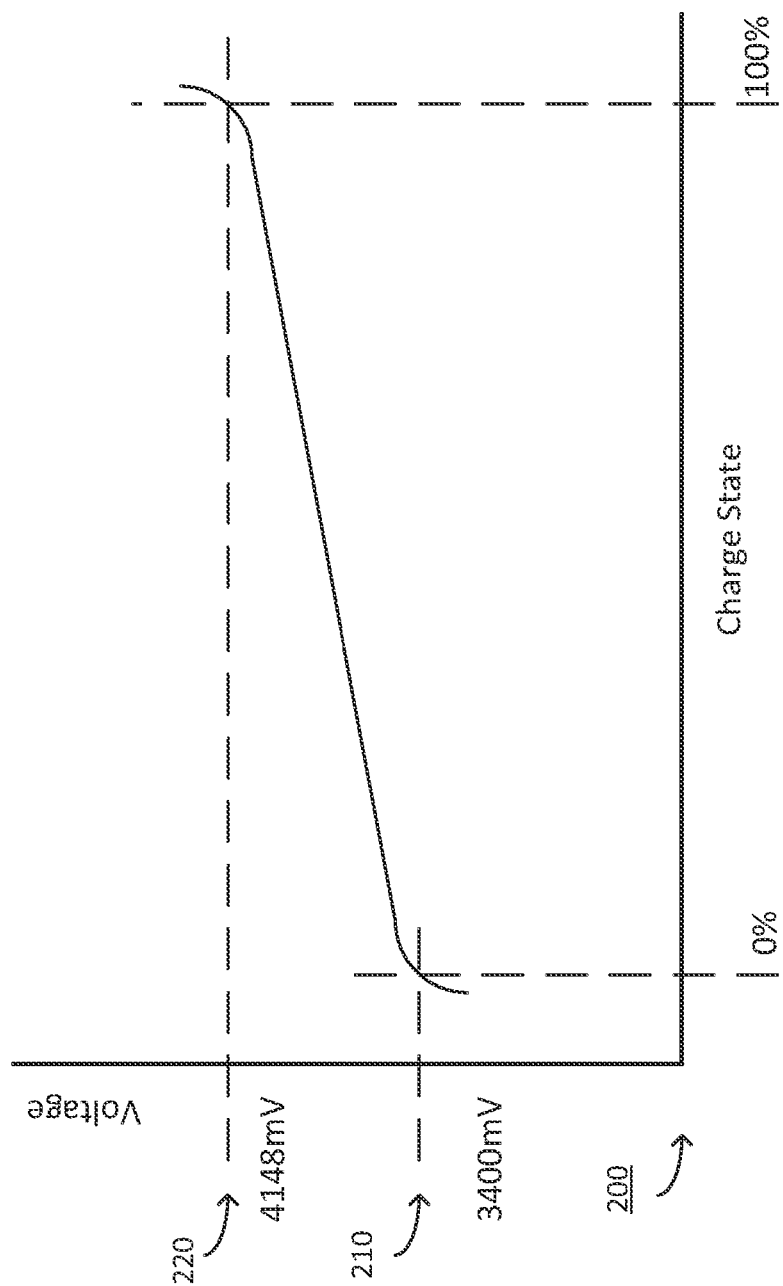
FIG. 2 is a graph of no load cell voltage versus charge state according to one embodiment.

Referring now to FIG. 2, a graph 200 of no load storage cell voltage versus storage cell charge state for a Lithium chemistry storage cell is shown. The graph is idealized, with salient points emphasized. For a rechargeable storage cell, the storage cell is considered completely discharged at a particular nonzero voltage 210. At this point, the storage cell voltage declines rapidly. Discharging a storage cell beyond this point can result in permanent storage cell damage. Similarly, a fully charged state is recognized by a rapid increase in storage cell voltage occurring at a particular voltage 220.

According to an embodiment, a set of relationships between no load voltages and associated known good charge states is determined. This relationship is dependent on storage cell type and storage cell manufacture. Changes to manufacturing processes, storage cell materials, or the like may change this relationship.

This set of relationships is produced, for example during manufacturing through testing. As an example, rapid changes in voltage are used to identify the fully discharged (0%) 210 and fully charged (100%) 220 points. By fully charging a storage cell, then discharging the storage cell under known conditions such as a resistive load or a constant-current load, periodically removing the load and measuring the no load storage cell voltage, the set of relationships between no load voltages and associated known good charge states are identified. This set of relationships may be checked and averaged, for example, over multiple storage cells from a manufacturing batch to develop typical per-cell values.

As a simplified example of this set of relationships for a representative cell, the measured cell voltage in millivolts (Cell mV) and associated charge state (SOC) are:

TABLE 1

| Cell mV | SOC |
|---|---|
| 3400 | 0 |
| 3463 | 10 |
| 3512 | 20 |
| 3554 | 30 |
| 3597 | 40 |
| 3653 | 50 |
| 3723 | 60 |
| 3809 | 70 |
| 3905 | 80 |
| 4015 | 90 |
| 4148 | 100 |

As shown above, for a representative cell the fully discharged cell voltage 210 is 3400 milliVolts (3.4 Volts) and the fully charged cell voltage 220 is 4148 milliVolts (4.148 Volts). Additionally, a no load voltage of 3653 milliVolts (3.653 Volts) represents a charge state of 50%.

This set of relationships 145 between no load voltages and associated known good charge states is stored in nonvolatile form as a data structure in memory 140, for use by battery controller 130 (referring again to FIG. 1). The data structure of this set 145 may be in the form of a table, a list, or other data structure suitable for use with battery controller 130.

In an embodiment, set 145 of no load voltages and associated known good charge states may be generated and stored for the battery overall, containing values corresponding to all storage cells in the battery. As an example, testing is performed on a representative battery comprising a plurality of series connected cells. A representative battery is, for example, a battery chosen from a group of batteries from the same manufacturing batch or same manufacturing type.

Battery voltages corresponding to fully discharged 210 and fully charged 220 are determined. The battery is charged and discharged under known conditions as described previously, with the load removed periodically and no load battery voltage measured, building up the set of relationships between no load voltages and associated known good charge states.

In another embodiment, set 145 of no load voltages and associated known good charge states is generated and stored for a representative storage cell in the battery. In operation, battery controller 130 uses the relationships in set 145 as determined for a single cell to represent all storage cells in the battery The testing and measurements described herein refer to no load voltage measurements made on storage cells and/or batteries. As is known in the art, the internal resistance of a storage cell means that the measured voltage of the cell under load is different from the measured voltage under no load. According to Ohm's law, this internal resistance creates a difference in measured voltage between load and no load states which is proportional to current. Lithium-ion storage cells have an internal resistance which is a complex function of many variables including but not limited to cell chemistry, construction and materials, and cell conditions such as charge state and temperature.

As used herein, a no load voltage is a voltage measured under conditions where the voltage drop caused by the internal resistance of one or more storage cells is negligible.

An example of such a no load state is when the electric vehicle is turned off. Another example of a no load state is where the current flowing to a load is below a predetermined threshold.

Figure 3:
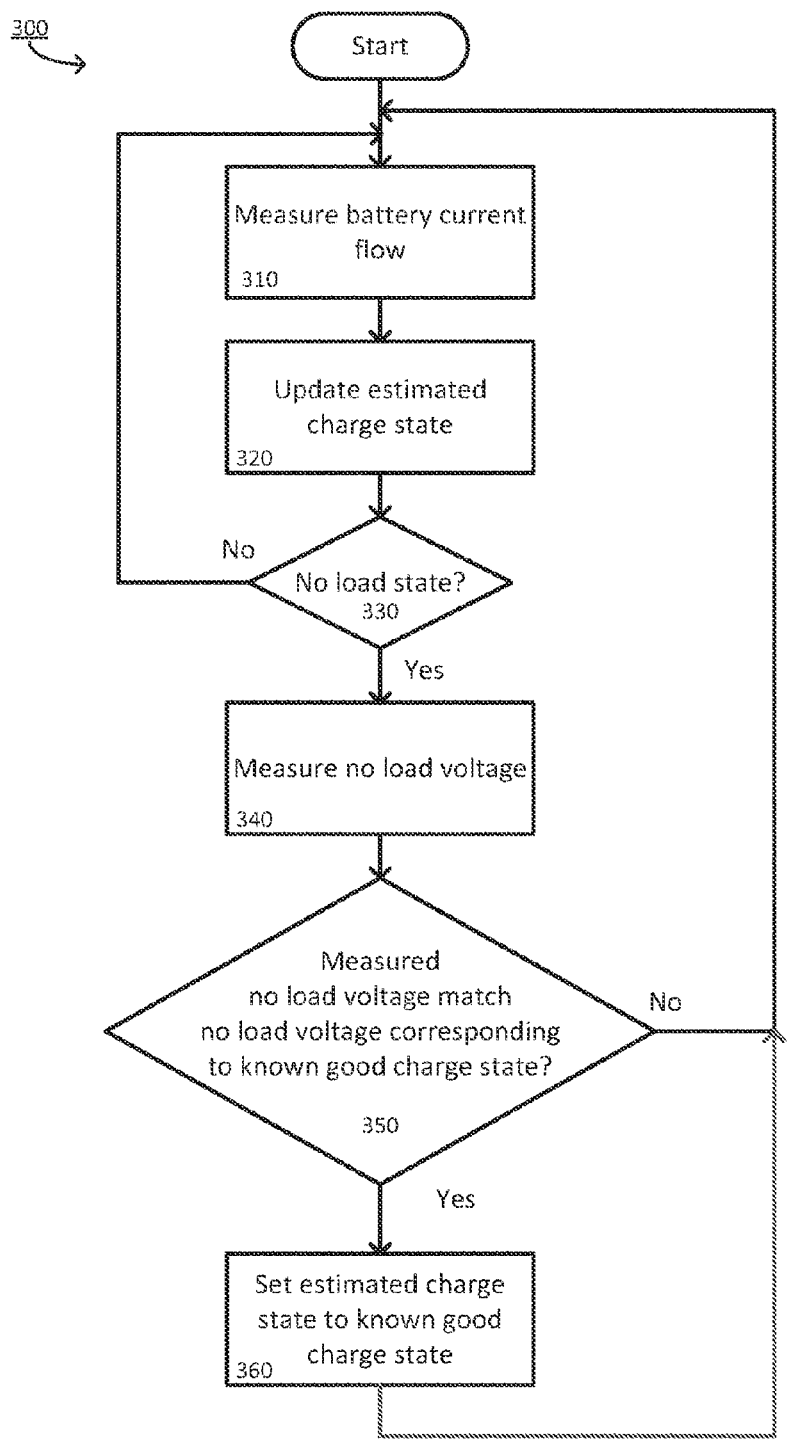
FIG. 3 is a flowchart of improved battery charge state determination according to one embodiment.

Referring now to FIG. 3, a flowchart of improved battery charge state determination according to an embodiment 300 is shown.

In step 310, battery current flow is measured. In one embodiment, battery controller 130 samples current flow on storage cells 112a, 112b using current sensor 114.

In step 320, the estimated charge state is updated. Battery controller 130 updates the estimated charge state, decreasing the estimated charge state if current sensor 114 measured current flowing out of storage cells 112a, 112b, and increasing the estimated charge state if current sensor 114 measured current flowing into storage cells 112a, 112b. This updated charge state may be coupled to fuel gauge 150.

In step 330, a test is made to determine if storage cells 112a, 112b are in a no load state. In one embodiment, this determination is made by the current sensed through current sensor 114 being below a threshold value. In some embodiments, the current sensed is below this threshold value for a predetermined period of time to allow the battery to recover to a voltage level which more accurately represents the charge state. In another embodiment, the no load state may be selected by other events, such as a user turning off the vehicle or stopping the vehicle.

If storage cells 112a, 112b are not in a no load state, processing continues with step 310, continuing the process of updating the estimated charge state.

In step 340 with storage cells 112a, 112b in a no load state, a measured no load voltage is determined. In one embodiment, battery controller 130 reads the no load voltage of the battery by reading the voltages of storage cells 112a and 112b through battery monitors 120a and 120b, and combining those voltages. The no load battery voltage is used for subsequent steps as the measured no load voltage.

In an additional embodiment, battery controller 130 reads the no load voltages of each individual storage cell in cells 112a, 112b. The lowest measured no load storage cell voltage is used in subsequent steps as the measured no load voltage. The storage cell with the lowest measured no load voltage will be the storage cell which is discharged first, and thus best represents the useable energy remaining in the battery.

In step 350, a determination is made if the measured no load voltage matches a previously determined no load voltage associated with a known good charge state. In an embodiment, memory 140 contains the set 145 of predetermined no load voltages and associated known good charge states. Set 145 is searched for an entry matching the measured no load voltage of step 340.

This search and match may be performed in a number of ways as known in the art. As an example, the measured no load voltage of step 340 is compared to set entries and a match found if the measured no load voltage and the set entry are within a preset tolerance. In another embodiment, the set may contain voltage ranges, such as a low and a high voltage range associated with a known good charge state. In another embodiment, if a close match for the no load voltage of step 340 is not found, interpolation (e.g., linear approximation) between set entries is used to determine a known good charge state.

As an example, if the no load voltage of step 340 is not found, two bounding entries are used. Referring to Table 1, assume the measured no load voltage is 3625 milliVolts. This is bounded by the entries for 3597 milliVolts representing a 40% charge state, and 3653 milliVolts representing a 50% charge state. Using interpolation, 3625 is 50% between 3597 and 3653. The known good charge state then is this same percentage between the two charge states, 40% and 50% or 45%.

It is to be understood that any of a number of interpolation methods may be used in addition to linear approximation.

In one embodiment set 145 contains no load voltages for the battery, and the associated known good charge states.

In an additional embodiment, set 145 contains no load voltages for a single storage cell and the associated known good charge states. As described herein, a set 145 of single storage cell no load voltages and their associated known good charge states may comprise measurements made of one representative cell, or may comprise the averages of measurements made over a number of storage cells.

In step 360, the estimated charge state is updated to the known good charge state. In an embodiment, the known good charge state from the matching table entry determined in step 350 updates the estimated charge state. This updated charge state is used by fuel gauge 150 to provide a more accurate indication of the battery's actual charge state.

After the estimated charge state is updated in step 360, the process of Coulomb counting resumes with step 310, now based on a known good charge state for the battery.

In some embodiments, an additional step is inserted between steps 340 and 350. In this added step, the measured no load voltage is compared to a set of limit voltages. If the measured no load voltage is within the set of limit voltages, processing continues with step 310. As determined by testing, and depending on battery and cell type, this set of limit voltages represents a voltage range known to not represent accurate charge states.

As an example of this process in operation, consider the process of charging a battery. Coulomb counting increases the estimated charge state during the charge process. Charging typically terminates when the sharp voltage rise seen at 220 of FIG. 2 occurs. Coulomb counting has increased the estimated charge state of the battery by a certain amount of energy, with accumulated errors, during this charging process. By applying the update process described herein on a no load voltage measurement of the charged battery, the estimated charge state is corrected to a known good charge state which corrects not only for accumulated errors from Coulomb counting, but also for inefficiencies in the charging process.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art, such as use in electric vehicles, electrically operated machinery such as motor-driven machinery, or other electrically operated devices.

In the foregoing specification, the invention is described with reference to specific embodiments thereof, but those skilled in the art will recognize that the invention is not limited thereto. Various features and aspects of the herein-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method for improved battery charge state determination for a battery comprising a series-connected plurality of storage cells, the method comprising:
   measuring current flow of the battery by a battery controller coupled to a current sensor,
   updating, by the battery controller, an estimated charge state based on the measured battery current flow,
   determining, by the battery controller at a time subsequent to initial operation of the battery, that the battery is in a no load state,
   measuring, by the battery controller coupled to a battery monitor coupled to the battery, a no load voltage of the battery,
   determining a known good charge state from the measured no load voltage of the battery using a set of no load voltages previously determined to correspond to known good charge states, and
   setting the estimated charge state to the known good charge state.

2. The method of claim 1 further comprising determining that the measured no load voltage is within a set of limit voltages, before the step of determining a known good charge state from the measured no load voltage of the battery using a set of no load voltages previously determined to correspond to known good charge states.

3. The method of claim 1 where the step of determining a known good charge state comprises matching the measured no load voltage of the battery to an entry in the set of no load voltages previously determined to correspond to known good charge states and using a charge state associated with the entry in the set of relationships corresponding to the measured no load voltage.

4. The method of claim 1 where the step of determining a known good charge state comprises using the measured no load voltage of the battery to interpolate between bounding entries in the set of no load voltages previously determined to correspond to known good charge states to determine a known good charge state.

5. The method of claim 1 where the battery is in a no load state when the current flow of the battery is below a threshold value.

6. The method of claim 5 where the current flow of the battery is below a threshold value for a predetermined length of time.

7. The method of claim 1 where the battery is coupled to an electric vehicle.

8. The method of claim 7 where the battery is in a no load state when the electric vehicle is turned off.

9. The method of claim 1 where the step of measuring the no load voltage of the battery comprises measuring the no load voltage on each of the plurality of series-connected plurality of storage cells and selecting a lowest no load voltage of the battery from the plurality of storage cells as the no load voltage used for determining a known good charge state of the battery so as to best represent the useable energy remaining in the battery.

10. The method of claim 1 where the estimated charge state is displayed on a fuel gauge.

11. The method of claim 10 where the fuel gauge is on a vehicle.

12. The method of claim 1 where the set of no load voltages previously determined to correspond to known good charge state is determined by testing a representative battery.

13. The method of claim 1 where the set of no load voltages previously determined to correspond to known good charge states is determined by testing a representative cell of a representative battery.

14. The method of claim 1 where the set of no load voltages previously determined to correspond to known good charge states is determined by testing and averaging results over a plurality of cells of one or more representative batteries.

15. The method of claim 1 where the set of no load voltages previously determined to correspond to known good charge states is stored in a nonvolatile memory in the battery monitor.

16. The method of claim 1 where the set of no load voltages previously determined to correspond to known good charge states is stored in a nonvolatile memory coupled to the battery monitor.

17. A system for improved estimated charge state determination of a battery comprising:
   a plurality of rechargeable storage cells connected in series to form the battery,
   a current sensor coupled to the battery for sensing battery current flow,
   a battery monitor coupled to the battery for monitoring the voltage of the battery,
   a memory containing a set of relationships between no load voltages and associated known good charge states, and
   a battery controller coupled to the current sensor and the battery monitor, wherein the battery controller is configured to:
      update the estimated charge state using sensed battery current flow,
      sense a no load condition on the battery at a time subsequent to initial operation of the battery,
      measure a no load battery voltage,
      determine a known good charge state from the measured no load battery voltage and the set of relationships, and
      set the estimated charge state to the known good charge state.

18. The system of claim 17 where the battery controller is further configured to determine that the measured no load voltage is within a set of limit voltages, before determining a known good charge state from the measured no load voltage of the battery using a set of no load voltages previously determined to correspond to known good charge states.

19. The system of claim 17 where the battery controller is configured to determine a known good charge state from the measured no load battery voltage and the set of relationships by matching the measured no load battery voltage to an entry in the set of relationships and a good charge state associated with the entry in the set of relationships matching the measured no load voltage.

20. The system of claim 17 where the battery controller is configured to determine a known good charge state from the measured no load battery voltage and the set of relationships by interpolating between bounding entries in the set of relationships to determine the known good charge state.

21. The system of claim 17 where the memory containing a set of relationships between no load voltages and associated known good charge states is part of the battery controller.

22. The system of claim 17 where the memory containing a set of relationships between no load voltages and associated known good charge states is coupled to the battery controller.

23. The system of claim 17 further comprising a fuel gauge coupled to the battery controller, the battery controller further configured to output the estimated charge state to the fuel gauge.

24. The system of claim 22 further comprising a vehicle containing the fuel gauge.

* * * * *